(12) United States Patent
Howard et al.

(10) Patent No.: US 6,917,193 B1
(45) Date of Patent: Jul. 12, 2005

(54) DISTANCE TOLERANT LEADLESS CURRENT SENSOR

(75) Inventors: Charles E. Howard, Silver Lake, IN (US); Kris C. Beutel, Fort Wayne, IN (US)

(73) Assignee: International Truck Intellectual Property Company, LLC, Warrenville, IL (US)

( * ) Notice: Subject to any disclaimer, the term of this patent is extended or adjusted under 35 U.S.C. 154(b) by 26 days.

(21) Appl. No.: 10/755,689

(22) Filed: Jan. 12, 2004

(51) Int. Cl.[7] .............................................. G01R 33/00
(52) U.S. Cl. ............................. 324/117 H; 324/117 R
(58) Field of Search ......................... 324/117 H, 117 R, 324/126–127, 142, 251–252

(56) References Cited

U.S. PATENT DOCUMENTS

| 4,296,377 A | 10/1981 | Ohkubo |
| 4,887,027 A | 12/1989 | Strasser |
| 5,041,780 A | * 8/1991 | Rippel ..................... 324/117 H |
| 6,040,690 A | * 3/2000 | Ladds ......................... 324/142 |
| 6,175,229 B1 | * 1/2001 | Becker et al. ........... 324/117 H |
| 6,472,878 B1 | * 10/2002 | Bruchmann ................. 324/424 |
| 6,570,373 B1 | 5/2003 | Viola |

* cited by examiner

Primary Examiner—Minh N. Tang
(74) Attorney, Agent, or Firm—Jeffrey P. Calfa; Dennis Kelly Sullivan; Susan L. Lukasik

(57) ABSTRACT

A leadless current sensing device utilizes a pair of radially aligned Hall Effect Sensors to generate a current measurement for a conductor without knowledge of the distance between the probe and conductor. The device has particular application to the automotive and truck assembly industry where current measurements at fixed points in an electrical system are required, but close tolerances on spacing of probes expensive.

8 Claims, 5 Drawing Sheets

DISTANCE TOLERANT LEADLESS CURRENT SENSOR

BACKGROUND OF THE INVENTION

1. Technical Field

The invention relates to current sensing devices and more particularly to a leadless current sensor using Hall Effect detectors.

2. Description of the Prior Art and Problem

U.S. Pat. No. 4,887,027 to Strasser describes a leadless current sensing probe which, when placed near a current carrying conductor, generates signals from which the probe's angle of orientation and distance from the conductor can be determined. Strasser teaches a probe for direct current (D.C.) electrical systems constructed using two Hall Effect plates, one placed forward of the other in a probe. It is anticipated that in use the end of the probe where the forward Hall Effect plate is located is directed toward the current carrying conductor. The Hall Effect plates have a common center axis, with the rearward plate rotated on the axis relative to the forward plate. The distance between the plates is treated as a known.

Hall Effect devices measure magnetic flux density by exhibiting a voltage across the devices proportional to the local magnetic flux density or by exhibiting changes in resistance as a function of magnetic field flux density (magneto resistive devices). It is well known that a wire carrying a current has a magnetic field associated therewith. If the wire can be treated as being linear and infinite in length the relationship between the current carried by the wire and the magnetic field flux density B at a distance r to the wire is:

$$B = \mu I / 2\pi r \quad \text{(Strasser equation (18))(1)}$$

where:

$\mu$ is the permeability of the medium surrounding the conductor, with the permeability for vacuum after being the default valve, I is the current in the conductor, and r is the minimum perpendicular distance to the wire.

Strasser rearranges equation (1) to derive the relationship:

$$I = B 2\pi r / \mu \quad \text{(Strasser equation (32))(2)}$$

From this relationship Strasser concludes that once "r" or distance is determined "I" or current can be solved for using measured magnetic flux. Strasser is able to determine distance by comparison of two voltage measurements taken across each of the pair of Hall Effect plates, a total of four measurements.

Current sensors are essential components in contemporary control systems for motor vehicles. Such sensors are preferably inexpensive and should not require leads connected to the wire in which current is to be measured. The Strasser device and other Hall Effect based current measuring devices provide leadless current measurement. However, many of the devices, other than Strasser, have required careful control, and prior knowledge of, the distance separating the Hall Effect based probe and the conductor. The Strasser device, though tolerant of changes is spacing between the probe and wire, still treats determination of the distance between wire and probe as a necessary step before determining the conductor current.

SUMMARY OF THE INVENTION

According to the invention there is provided a leadless current sensing system for a conductor. The sensing system includes a framework for capturing a section of a conductor. First and second Hall Effect sensors are mounted on the framework at different radial distances from the captured section of the conductor. The sensors are also mounted to be perpendicular to lines of equal flux density as occur around the captured section of the conductor when carrying a current. The sensing system is intended for installation on a motor vehicle having an on board computer and a controller area network. A data link interface between the sensors and the controller area network formats sensor data relating to magnetic flux density for transmission over the controller area network, which, upon receipt by the onboard computer, is used by the computer for determining current in the conductor. The calculation treats the distance between the sensors as known and disregards values for distances between the sensors and the conductor.

Additional effects, features and advantages will be apparent in the written description that follows.

BRIEF DESCRIPTION OF THE DRAWINGS

The novel features believed characteristic of the invention are set forth in the appended claims. The invention itself however, as well as a preferred mode of use, further objects and advantages thereof, will best be understood by reference to the following detailed description of an illustrative embodiment when read in conjunction with the accompanying drawings, wherein:

DETAILED DESCRIPTION OF THE INVENTION

Figure 1:
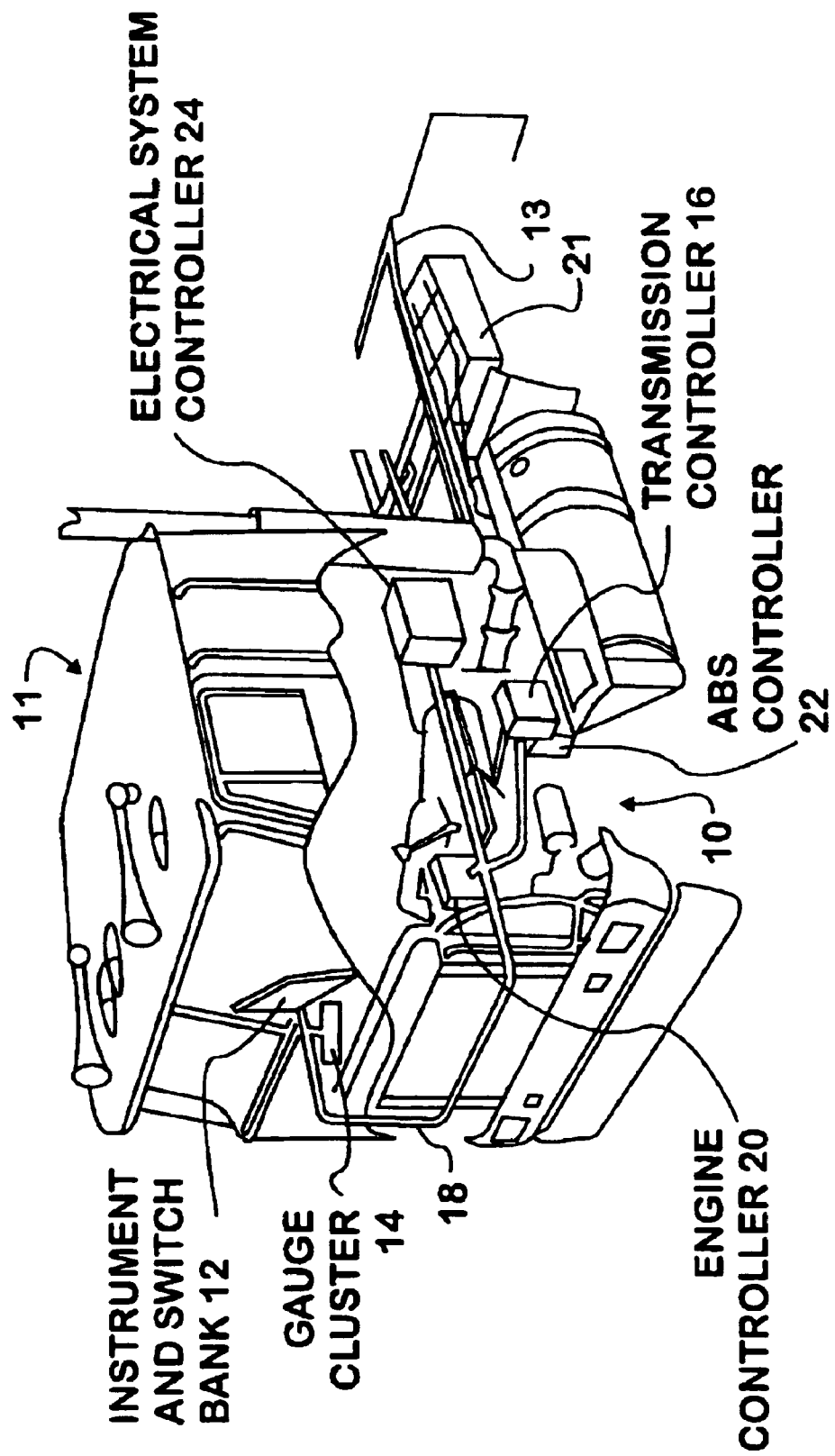
FIG. 1 is a perspective view in partial cutaway of a vehicle truck and an electrical system for the truck.

FIG. 1 is a perspective view of a vehicle 11 and of a vehicle electrical control system 10 installed on the vehicle. Vehicle electrical control system 10 comprises a network which may, in one embodiment, comprise a twisted pair (either shielded or unshielded) cable operating as a serial data bus/data link 18. One node of bus 18 is an electrical system controller (ESC) 24, which is a major component of a vehicle electronic control system. ESC 24 manages a number of vocational controllers connected to serial data bus 18 as nodes. ESC 24 also monitors some of the sensors used on vehicle 11 including, in a preferred embodiment of the present invention, the current sensing arrangement of the present invention and is programmed to determine current from detected magnetic fields. Collectively, serial data bus 18 and the various nodes attached thereto form a controller area network (CAN).

Active vehicle components are typically controlled by one of a group of autonomous, vocational controllers, which include an instrument and switch bank 12, a gauge cluster 14, an engine controller 20, a transmission controller 16, and an antilock brake system (ABS) controller 22, all of which are connected to ESC 24 over a serial data bus 18 and all of which are connected to the serial data bus as nodes. The autonomous controllers include local data processing and programming and are typically supplied by the manufacturer of the controlled component. For each autonomous controller there is a defined set of variables used for communications among the autonomous controller and the other data processing components on the network or attached to the network. Gauge cluster 14, transmission controller 16 and engine controller 20 all communicate with ESC 24, which also monitors inputs received from the auxiliary instrument and switch bank 12 over the serial communication link in harness 18. Detected current may be of interest to any one of a number of the controllers depending upon the application of the sensor. High overall current demand may necessitate an increase in engine output, involving the engine controller 20. Or a current sensor could be applied to monitor operations of a component, such as a light bulb, where the absence of a current can indicate failure.

Auxiliary power for vehicle 11, particularly used for cranking and starting an engine, is supplied by one or more lead acid batteries 21, shown installed toward the rear of the vehicle from a vehicle frame rail 13. Electrical power from batteries 21 may be supplied upon moving a key switch from an off position to an on position, without cranking the vehicle engine. Battery current monitoring is among the more important applications of current monitoring sensors.

Figure 2:
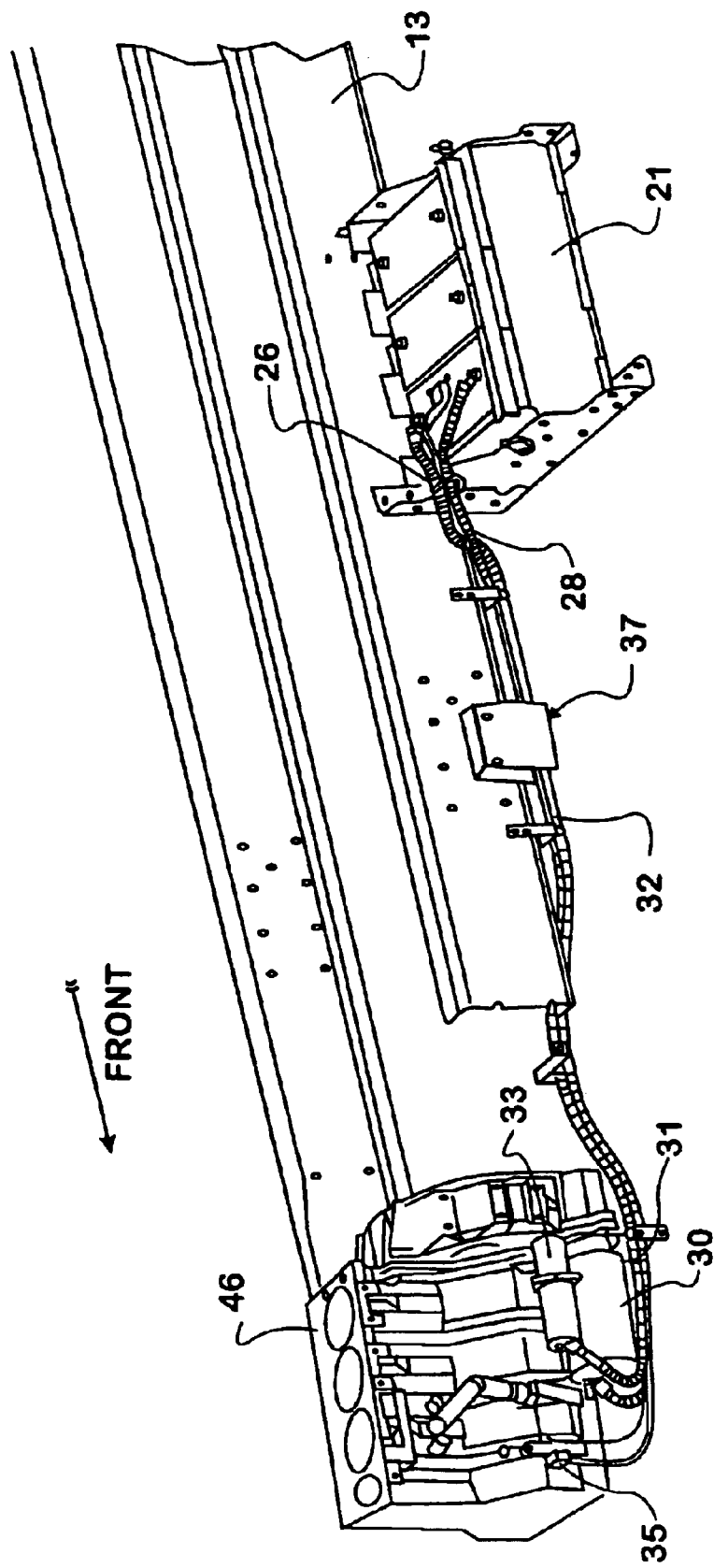
FIG. 2 is a perspective view of a vehicle chassis illustrating a possible mounting position for batteries on the vehicle's frame and cables used to attach the batteries to the charging and engine starting systems.

FIG. 2 illustrates an array of batteries 21 and the manner of connection of the batteries to a starter system 30 for an engine 46 installed on vehicle 11. Batteries 21 are connected in parallel to supply a high amp/hour capacity to vehicle starter system 30 during cranking. A negative terminal battery cable 26 is connected from a negative terminal of one of batteries 21 to a terminal of a starter motor 31, both of which are connected to the vehicle chassis, which serves as a floating ground in a conventional manner. A positive terminal battery cable 28 is connected between a positive terminal from the same one of batteries 21 to an input terminal on a starter system component 33 through a leadless current sensor 37. Negative terminal battery cable 26 is routed around and preferably magnetically shielded from leadless current sensor 37. Terminal cables 26 and 28 are usually 0000AWG cables. A framework 32 may be used to hold a section of positive terminal battery cable 28 straight adjacent where leadless current sensor 37 is positioned.

Figure 3:
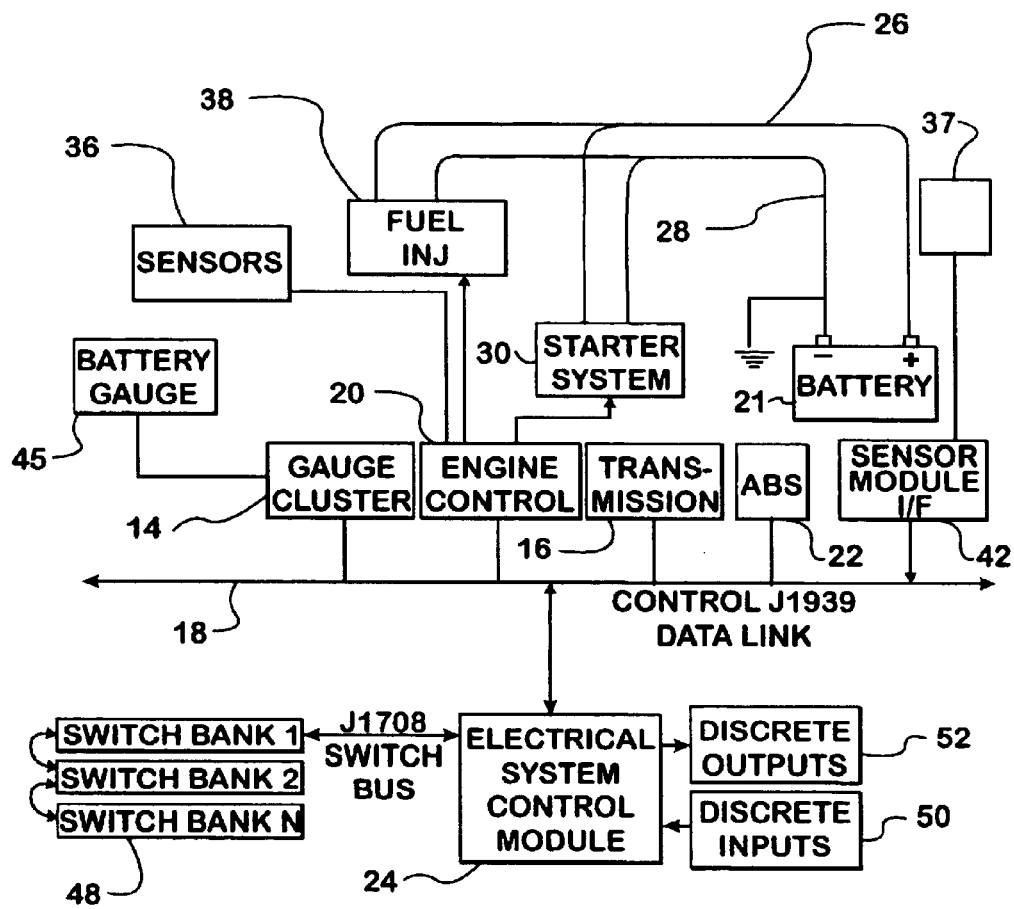
FIG. 3 is a block diagram of a vehicle electronic control network.

FIG. 3 illustrates electronic control of a vehicle 11 schematically, based on a network and an overall electrical system controller 24 as adapted to incorporate a leadless current sensor. As already described, ESC 24 communicates with several autonomous controllers over a SAE J1939 data link 18, including a gauge cluster 14, a transmission controller 16, an antilock brake system controller 22 and an engine controller 20. Each of these local autonomous controllers may in turn receive data directly from switches and sensors, as ESC 24 does from a switch bank 48 and discrete input section 50. Discrete inputs may include ignition key switch position and start button position. Engine controller 20 is commonly used to monitor a number of operational sensors on a vehicle 11 because of the immediate need of the engine controller for such measurements in controlling fuel flow and air/fuel mixture control to engine 46. Each local controller may provide control or informational signals to local discretely controllable components, as ESC 24 does with discrete output section 52. A sensor module bus interface 42 receives analog signals from current sensor 37, digitizes the signals, and formats the digital for transmission over data link 18.

Current measurement is illustrated as being made with respect to a battery cable 26 using a Hall Effect leadless current sensor 37 disposed alongside the battery cable. However, current measurement may be made with respect to any cable of interest on a vehicle.

Leadless current sensor 37 is positioned relative to a cable where magnetic field density around the cable can be approximated treating the cable as a narrow gauge linear conductor of infinite length. Leadless current sensor 37 provides measurements of magnetic flux density around a conductor of interest at two differentially spaced points on a radial from the cable. Magnetic flux density around the cable for direct current for two differentially spaced points on a single radial from the conductor can be found by applying Equation (1) to the two points as follows:

$$B_1 = \mu I / 2\pi r_1 \tag{3}$$

for a point a distance $r_1$ from the conductor and $$B_2 = \mu I / 2\pi r_2 \tag{4}$$

for a point a distance $r_2$ from the conductor where $r_1$ is greater than $r_2$. The distance $r_1$ can be expressed in terms of $r_2$ and a known distance $\Delta r$ separating the two points.

$$r_1 = r_2 + \Delta r \tag{5}$$

Substituting for $r_1$ from equation (5) into equation (3) yields the relationship:

$$B_1 = \mu I / 2\pi (r_2 + \Delta r) \tag{6}$$

From this it can be derived that:

$$r_2 = \mu I / 2\pi B_1 - \Delta r \tag{7}$$

Substituting the result of equation (7) back into equation (4) allows $r_2$ to be eliminated:

$$B_2 = \mu I / 2\pi (\mu I / 2\pi B_1 - \Delta r) \tag{8}$$

Now solving for I (current), the only unknown, may be done. Simplifying equation (8) provides:

$$B_2 = \mu I B_1 / (\mu I - 2\pi B_1 \Delta r) \tag{9}$$

Multiplying both sides of equation (8) by the denominator of the right side yields:

$$\mu B_2 I - 2\pi B_1 B_2 \Delta r = \mu I B_1 \tag{10}$$

Grouping all terms containing I on the left side results in:

$$I(\mu B_2 - \mu B_1) = 2\pi B_1 B_2 \Delta r \tag{11}$$

And finally:

$$I = 2\pi B_1 B_2 \Delta r / (\mu B_2 - \mu B_1) \tag{12}$$

Thus current can be accurately approximated knowing only the distance between the points where the flux density measurements are taken, provided the conductor can be treated as a linear conductor of infinite length at both points and permeability considerations adjacent the sensors are controlled. Electrical system controller (ESC) 24 is readily programmed to determine current from measurements of magnetic flux density supplied by leadless current probe 37 and passed to the ESC over data link 18.

Figure 4:
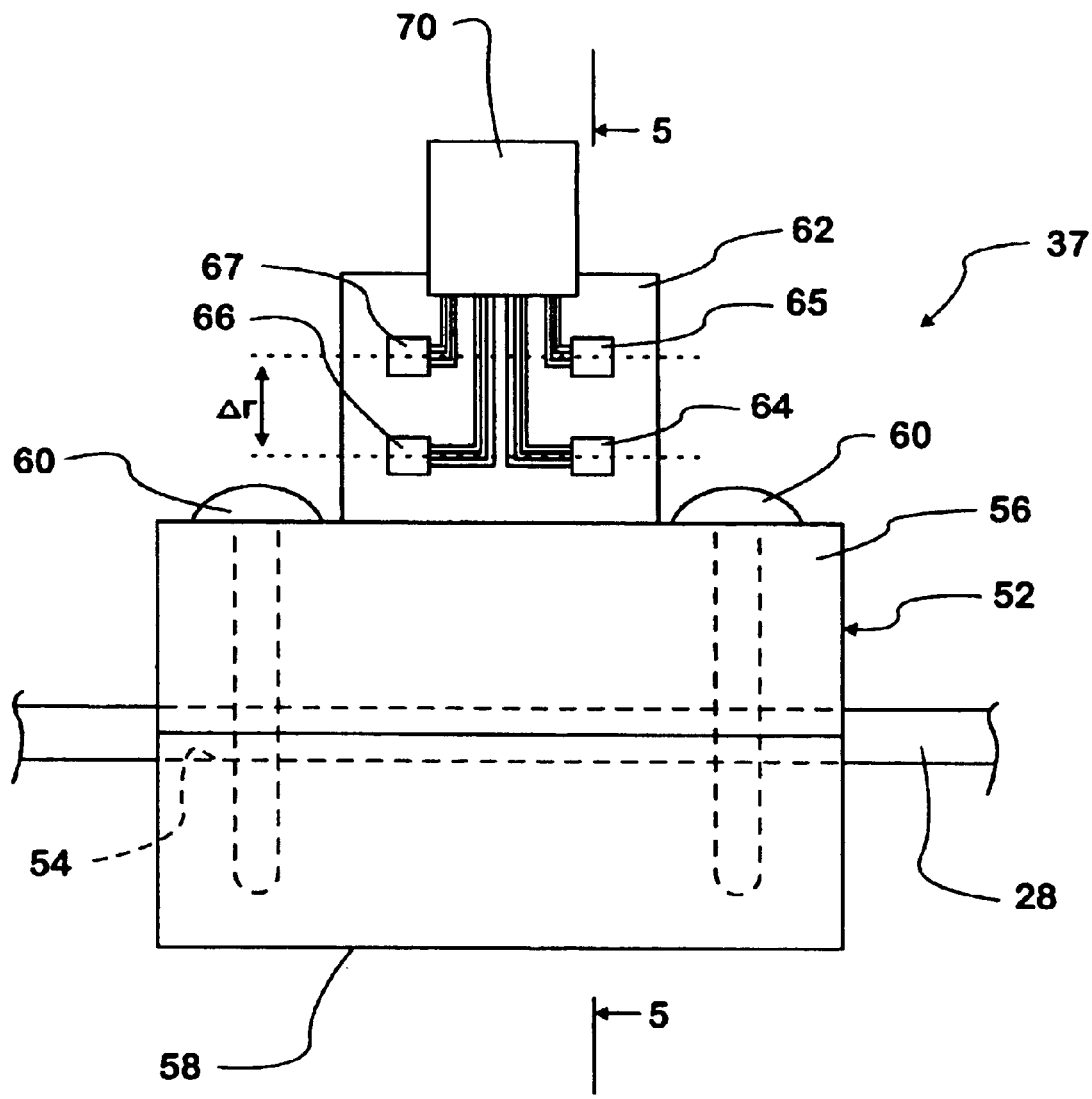
FIG. 4 is a front elevation view of a leadless current sensor in accordance with one embodiment of the present invention.
Figure 5:
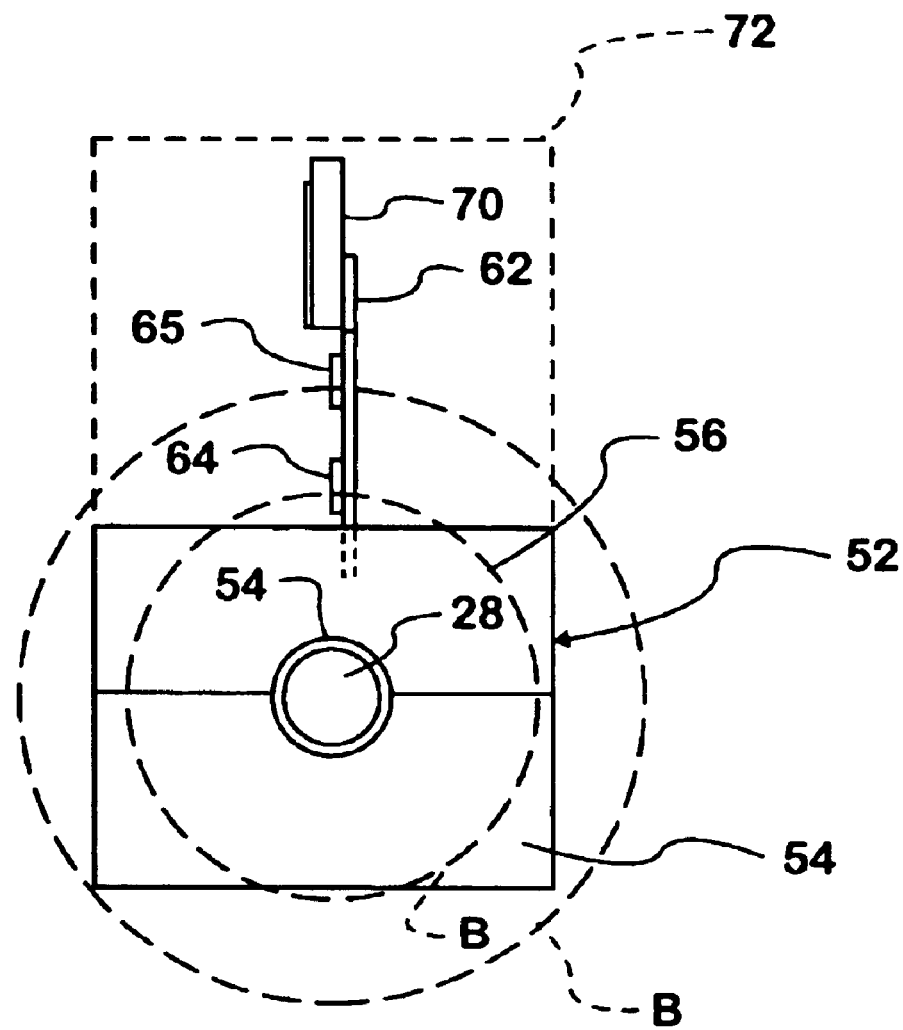
FIG. 5 is a cross sectional view of the leadless current sensor of FIG. 4 taken along lines 5—5.

In a preferred embodiment, leadless current sensor 37 is implemented by capturing a conductor for electrical current and positioning two sets of Hall Effect sensors 64–67 relative to the conductor for measuring magnetic flux density as illustrated in FIGS. 4 and 5. The distance of the Hall Effect sensors 64–67 from and orientation with respect to cable 28 is fixed in a given application, however, the distance of the sensors from the cable may vary from vehicle to vehicle and need not be known. Cable 28 is held in a housing 52 comprising upper and lower halves 56 and 58. A conduit 54 is defined between adjacent faces of the upper and lower halves 56 and 58 which is perpendicular to the direction of alignment (and spacing) of pairs of Hall Effect Sensors. The first pair of sensors includes sensors 64 and 65. The second pair of sensors includes sensors 66 and 67. Housing halves 56 and 58 are held to one another using a plurality of plastic screws 60. Housing 56 is preferably fabricated from a material having a permeability close to that of vacuum, which includes a wide variety of diamagnetic and paramagnetic materials.

Extending upwardly from a base in housing 56 is a circuit board 62 which is preferably disposed almost directly above conductor 28, paralleling the plane of the conductor. Circuit board 62 positions each of two sets of Hall Effect Sensors 64–67 in a plane with the center axis of cable 28 and perpendicular to the lines of equal magnetic flux B. Each pair of sensors, including sensors 64 and 65 as one pair, and sensors 66 and 67 as a second pair, is located with one sensor aligned on the other on a radial extending from cable 28. The distance Δr between sensors of a pair is known and fixed. Each of Hall Effect sensors 64–67 modifies an electrical signal applied to the sensor in a way dependent upon the intensity of the magnetic flux through the sensor. For application to a battery cable the pair of sensors comprising sensors 64 and 65 are preferably selected for measuring currents in from –300 to +300 amperes and the anticipated distance. The second set of sensors 66 and 67 are used for currents from 0 to 2000 amperes. The first current range corresponds to normal vehicle operation while the second range corresponds to surge currents occurring during engine cranking. Two sets are used for a vehicle battery cable because of range limits exhibited by contemporary Hall Effect sensors. Other applications may not require two sets of sensors.

The invention provides a leadless current sensor and implements a current determination algorithm which works regardless of the distance of the probe from the conductor, as long as the probe is at a distance where both sensors in a pair are spaced from the conductor in a way that allows the conductor to be treated as an infinite, linear current path.

While the invention is shown in only one of its forms, it is not thus limited but is susceptible to various changes and modifications without departing from the spirit and scope of the invention.

What is claimed is:

1. A leadless current sensing system for a conductor, comprising:
    a framework for capturing a section of a conductor;
    first and second Hall Effect sensors positioned with respect to the framework at different radial distances from the captured section of the conductor and to be perpendicular to lines of equal flux density as occur around the captured section of the conductor; and
    data processing means for determining current in the conductor from the magnitudes of first and second signals generated by the first and second Hall Effect sensors, respectively, treating the distance between the sensors as known and disregarding the values for distances between either sensor and the conductor.

2. The leadless current sensing system as set forth in claim 1, further comprising:

third and fourth Hall Effect sensors positioned with respect to the framework at different radial distances from the captured section of the conductor and to be perpendicular to lines of equal flux density as occur around the captured section of the conductor for providing measurements of magnetic flux densities over a different useful range of currents in the conductor than the first and second Hall Effect sensors provide.

3. The leadless current sensing system as set forth in claim 2, the framework further comprising:
    a opening through the framework for fitting around the conductor.

4. A current sensing system for conductors installed on a motor vehicle including a controller area network and an onboard computer coupled to the controller area network and programmable to operate on data received over the controller area network, the current sensing system comprising:
    a framework for capturing a section of a conductor;
    first and second Hall Effect sensors mounted on the framework at a known distance from one another and at different radial distances from the captured section of the conductor, the first and second Hall Effect sensors being mounted to be perpendicular to lines of equal flux density around the captured section of the conductor;
    a data link interface from the first and second Hall Effect sensors to the controller area network for transmitting sensor data relating to magnetic flux density from the first and second Hall Effect sensors over the controller area network; and
    a program executable by the onboard computer, the program operating on the sensor data relating to magnetic flux density for determining current in the conductor.

5. The current sensing system of claim 4, further comprising:
    third and fourth Hall Effect sensors mounted on the framework at a known distance from one another and at different radial distances from the captured section of the conductor, the third and fourth Hall Effect sensors being mounted to be perpendicular to lines of equal flux density around the captured section of the conductor; and
    the data link interface being further coupled to format and transmit data from the third and fourth Hall Effect sensors to the controller area network for transmitting sensor data relating to magnetic flux density over the controller area network.

6. The current sensing system of claim 5, further comprising:
    the conductor being a vehicle battery table; and
    the framework being adapted to depend from a motor vehicle frame rail.

7. A motor vehicle comprising;
    a controller area network;
    an onboard computer coupled to the controller area network and programmable to operate on data received over the controller area network;
    a plurality of electrical conductors installed on the vehicle;
    a framework for capturing a section of a conductor;
    first and second Hall Effect sensors mounted on the framework at a known distance from one another and at different radial distances from the captured section of the conductor, the first and second Hall Effect sensors being mounted to be perpendicular to lines of equal flux density around the captured section of the conductor;

a data link interface from the first and second Hall Effect sensors to the controller area network for transmitting sensor data relating to magnetic flux density from the first and second Hall Effect sensors over the controller area network; and a program executable by the onboard computer, the program operating on the sensor data relating to magnetic flux density for determining current in the conductor.

8. The motor vehicle as set forth in claim 7, further comprising:

third and fourth Hall Effect sensors mounted on the framework at a known distance from one another and at different radial distances from the captured section of the conductor, the third and fourth Hall Effect sensors being mounted to be perpendicular to lines of equal flux density around the captured section of the conductor; and the data link interface being further coupled to format and transmit data from the third and fourth Hall Effect sensors to the controller area network for transmitting sensor data relating to magnetic flux density over the controller area network.

* * * * *